United States Patent [19]

Sanders et al.

[11] Patent Number: 5,684,590
[45] Date of Patent: Nov. 4, 1997

[54] FIBER OPTIC GYROSCOPE SOURCE WAVELENGTH CONTROL

[75] Inventors: Glen A. Sanders; Clarence E. Laskoskie, both of Scottsdale, Ariz.

[73] Assignee: Honeywell Inc., Minneapolis, Minn.

[21] Appl. No.: 586,019

[22] Filed: Dec. 29, 1995

[51] Int. Cl.⁶ ............................... G01C 19/72
[52] U.S. Cl. .................. 356/350; 372/6; 372/32
[58] Field of Search ................. 356/350; 372/6, 372/32

[56] References Cited

U.S. PATENT DOCUMENTS 5,136,600  8/1992  Fioric et al. ................. 372/32
5,313,480  5/1994  Fioric et al. ................. 372/6

*Primary Examiner*—Samuel A. Turner
*Attorney, Agent, or Firm*—John G. Shudy, Jr.

[57] ABSTRACT

A pumped rare-earth fiber source wavelength control device, having source wavelength control effected by pump source wavelength and power control. The maintaining of pump wavelength and power control can be attained several ways such as by use of a wavelength sensitive coupler, a short length of fiber having an embedded grating, and a modulated grating embedded fiber.

3 Claims, 4 Drawing Sheets

FIBER OPTIC GYROSCOPE SOURCE WAVELENGTH CONTROL

BACKGROUND OF THE INVENTION

The invention pertains to high performance optical gyroscopes based on the Sagnac effect. Particularly, the invention pertains to interferometric fiber optic gyroscopes (FOGs) having sources with accurate wavelength control, and more particularly, tightly controlled wavelengths with relaxed component tolerances, for precise gyroscope scale factor control. Accurate scale factors are needed despite drift and aging effects in source components because the gyro scale factor which is directly proportional to wavelength, cannot be calibrated during the period over which the instrument is expected to accurately perform.

SUMMARY OF THE INVENTION

The light source wavelength stability directly affects the gyroscope scale factor stability. Broadband semiconductor sources traditionally used for interferometric FOGs lack the inherent wavelength stability for the most precise applications. One method of achieving a high degree of wavelength stability, such as one part per million (ppm), is to use a reference of equal stability; however, such a reference and a method of transfer to the gyro source are not available in practical form. The advent of broadband rare-earth doped fiber light sources (FLSs) offers interesting new possibilities. In this case (see FIG. 1), light from a semiconductor laser at $\lambda_p$ is used to optically pump rare earth ions doped into special fiber. The rare earth ions then decay out of their excited state, emitting a broad spectrum of light about a center wavelength $\lambda$ that is used as the gyro light source. Even though the semiconductor source is not stable to one ppm, the output wavelength $\lambda$ of the FLS is only a loose function of the pump wavelength $\lambda_p$ and control of the latter parameter with a cruder, but readily available reference which is now possible with the present invention. The objective is to tightly control the gyroscope light source wavelength, lambda ($\lambda$), and to effect scale factor stability. The problem with directly controlling $\lambda$ requires the direct measurement and stabilization of $\lambda$ to a more stable reference of the desired wavelength accuracy. Thus one part per million wavelength accuracy of a light source requires a wavelength reference of one ppm accuracy to measure and control the source wavelength.

The invention involves wavelength control or monitoring of doped-fiber or doped-material light sources. In a fiber light source, the three principal parameters of the two components from which a fiber light source wavelength $\lambda$ depends, are the pump wavelength $\lambda_p$ and power $P_p$, and the doped fiber temperature. The temperature dependence is repeatable and can be calibrated. The dependence of the source wavelength on the pump wavelength is small, that is, typically less than 1/30. So by controlling the pump wavelength, as shown in FIG. 1, to 300 ppm, 10 ppm stability may be achieved in the light source wavelength $\lambda$. Thus, one may be allowed the use of a cruder wavelength reference than would be necessary to control the source wavelength directly. Such an approach results in lower costs. As noted, the achievement of less than one ppm in a wavelength reference for measuring or controlling the source wavelength directly is not available in practical form. However, the feasible way to do such measurement is to measure and control the pump wavelength to less than 30 ppm (which is possible). Further, the pump wavelength measurement device may be a practically realizable wavelength-division-multiplexing (WDM) fused fiber optic coupler or a grating conveniently embedded in a fiber which can be used. These two devices may also be conveniently used to measure the third important parameter, the pump power, in determining source wavelength. This measurement information may be furnished to a servo to control the pump power.

DESCRIPTION OF EMBODIMENTS

Figure 1:
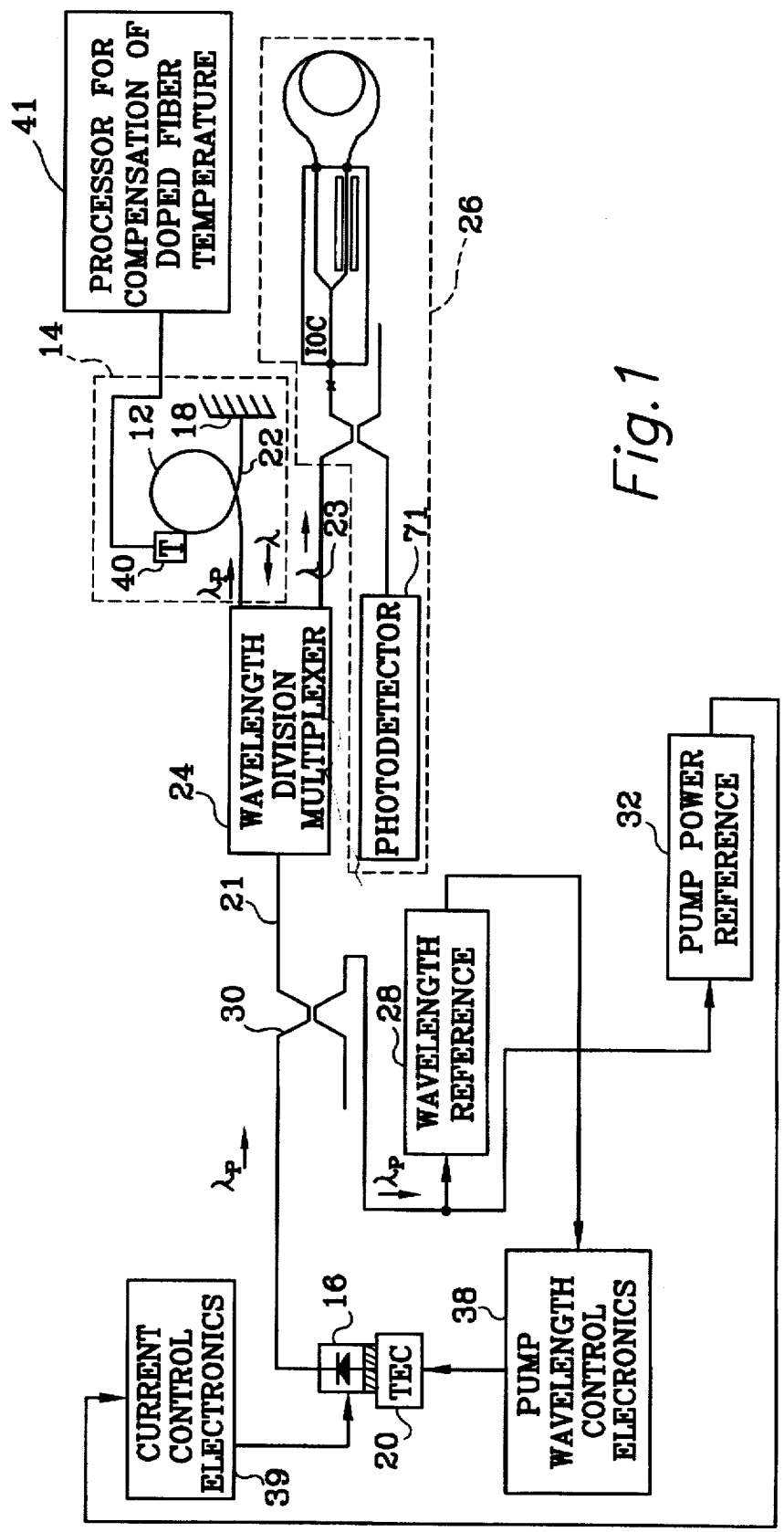
FIG. 1 illustrates the basic structure of source wavelength control via pump wavelength and power control.

The mean source wavelength $\lambda$ (e.g., Erbium) is dependent on the temperature of a doped fiber 12. An advantage of a fiber light source 14 is that its temperature sensitivity is small and the sensitivity to pump 16 wavelength (thus pump temperature) is small. For example, Erbium-doped fiber (EDF) light sources have a temperature coefficient of typically less than 7 ppm/degree Centigrade (C) change in EDF temperature. This is true since the energy levels in Er:Silica are principally derived from Stark splitting (due to local electric fields). Thus, the fiber light sources offer one to two orders of magnitude improvement over the 400 ppm/degree Centigrade wavelength dependencies of its own semiconductor light source pump diode or a common superluminescent diode (SLD). The residual less than seven ppm/degree C fiber light source wavelength temperature dependence is a predictable function over time since it relies only on the Boltzmann-described statistical occurrence of energy levels; provided that the pump wavelength and the pump power do not change. In particular, the upper and lower lasing levels are each split into a manifold of several states. The specific resulting temperature coefficient is then given by the Boltzmann distribution, which describes the statistical occupation of energy levels of each manifold over temperature.

Light source 14 has a doped fiber, such as with Erbium, of which pump light of $\lambda$ enters and impinges on a non-reflecting end or termination 18. Light source 14 utilizes a single pass backward pumped with no reflection. Other pumping configurations of light source 14 may include a two pass device having a reflective end 18 being forward or backward pumped. Source 14 could also be single pass forward pumped, with a nonreflective end 18.

Typical pump 16 wavelengths are nominally 980 nanometers (nm) and 1480 nm. The source 14 wavelength can be about 1550 nm. The dependence of source 14 wavelength on pump wavelength for both 1480 nm and 980 nm pumping varies with the exact quiescent mean pumping wavelength. For a typical 1480 nm case, the quantitative advantage of fiber light source 14 is that a 0.1 degree° C. change in the pump 16 laser temperature ($T_p$) gives a 40 ppm (0.06 nm) change in pump 16 wavelength, but less than a 1.3 ppm change in the source 14 wavelength. Similarly, depending on the exact design, a 1.0 milliampere (mA) change in pump current gives a 0.1 milliwatt (mW) change in pump power, but causes only a source wavelength change between 0.3 ppm and 1 ppm. Typically, the pump laser temperature ($T_p$) and pump power ($P_p$) are controlled, the EDF temperature monitored and compensated (or controlled), and the source 16 wavelength k can therefore be determined without measuring it directly.

In rare earth doped broadband sources such as those based on Erbium, the wavelength is very repeatable if the Erbium-fiber temperature, the pump power and the pump wavelength are constant. Since rare earth ions, such as Erbium, are a good wavelength standard, provided that the pump mean wavelength ($\lambda p$) and power (Pp) are constant, and have a low sensitivity to variation of pump mean wavelength and power; the ions achieve a high stability in wavelength with crude measurement and control of pump mean wavelength and power. If the temperature of the Erbium-fiber is suitably stabilized, and with a wavelength control reference of a 10 ppm stability (for stabilizing the pump wavelength), and a direct pump power control of a 50 microwatt stability, then a source wavelength stability of 0.3 ppm may be attained. The pump diode 16 power measurement is easily accomplished by a standard PIN photodetector.

The wavelength dependence on pump wavelength may vary with exact design choices such as nominal values of $\lambda p$, EDF temperature and EDF length (for a given EDF composition). In a typical design, a temperature stabilization of pump diode 16 to within 0.025 degree C. (over various environments) is necessary to achieve the pump wavelength $\lambda_p$ stability (0.015 nm) resulting in less than 0.3 ppm scale factor variation. The applicants have demonstrated control of semiconductor light source temperatures to better than 0.02 degree C. over wide thermal environments using a thermoelectric cooler (TEC) 20. Similarly, pump sources with TECs are available with adequate heating/cooling capacity over a −55 to +90 degree C. temperature range. Note that the requirements on pump wavelength repeatability are relatively modest compared to the resulting FLS repeatability; however, in the most stringent (<1 ppm) applications, direct control may be necessary. For instance, in the event that aging effects are observed that result in pump diode wavelength shifts over time, a wavelength control device such as a fiber Bragg grating may need to be employed to directly control the pump wavelength.

Wavelength division multiplexer 24 has a coupler or other kind of splitter whose light splitting is wavelength sensitive. The coupler has an input port 21 at which pump 16 light of $\lambda_p$, enters, and input/output port 22 at which pump 16 light of $\lambda_p$ exits and enters light source 14 light of $\lambda$ enters. From port 23 exits light source 14 light of $\lambda$ which enters fiber optic gyroscope 26. Pump 16 light cannot exit port 23, and source light cannot exit port 21 of wavelength division multiplexer 24.

A pump power tap coupler 30 is for tapping power from pump 16 light of $\lambda_p$ for wavelength reference 28 and pump power reference 32. The output signal of wavelength reference 28 goes to pump wavelength control electronics 38 which outputs a signal to cooler 20 that controls the temperature of pump laser diode 16 to maintain the stability of wavelength $\lambda_p$ of the pump laser light. An output signal from the pump power reference 32 goes to current control electronics 39 that controls the current to pump laser diode 16 to maintain the stability of pump 16 power $P_p$.

Temperature sensor 40 detects the temperature of Erbium-doped fiber 12 of light source 14 and provides an indicative signal to processor 41 for providing compensation due to the Erbium-doped fiber 12.

Figure 2:
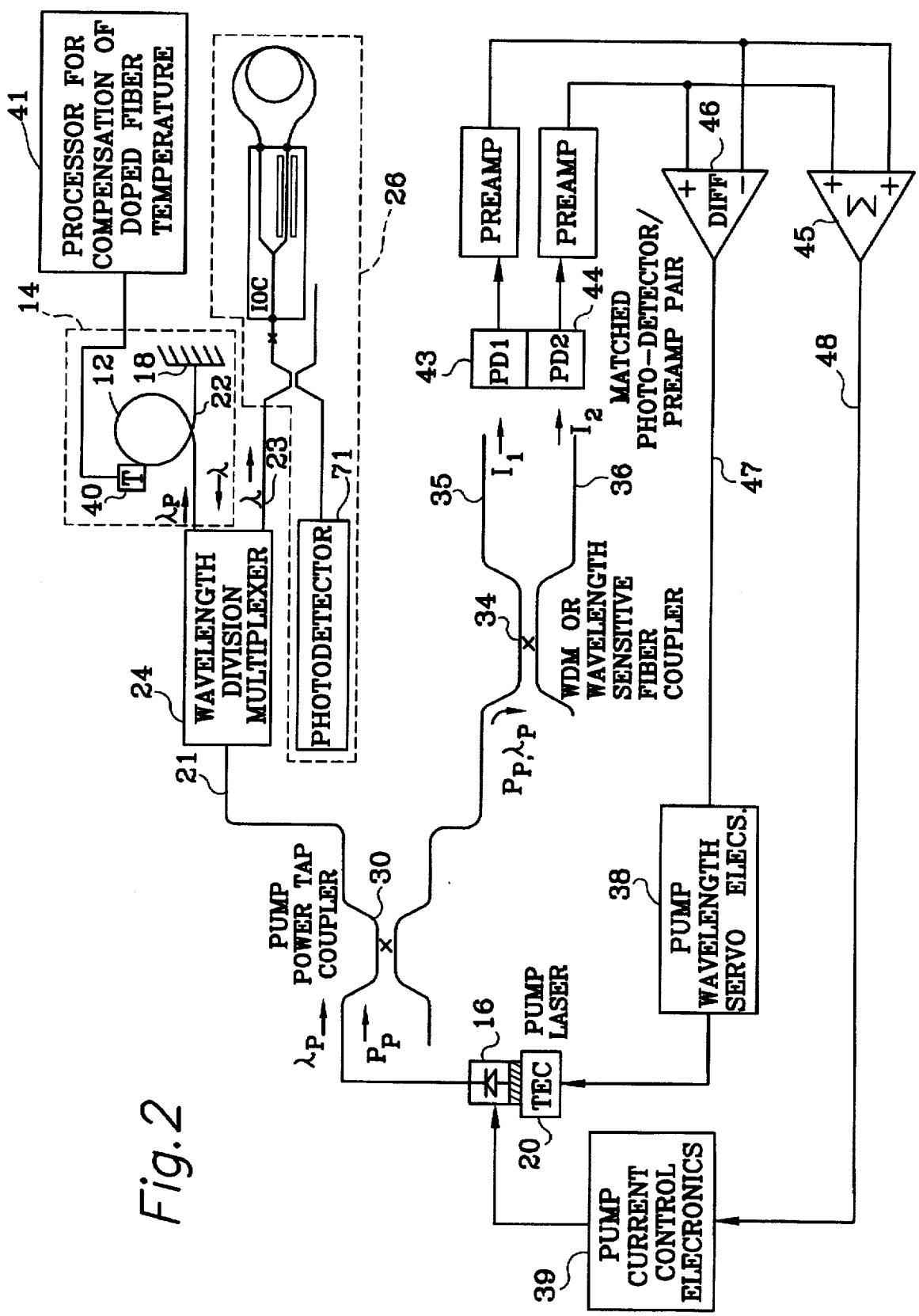
FIG. 2 is a diagram of source wavelength maintenance depending on pump wavelength and power controlled by use of a wavelength sensitive fiber coupler.

The present invention uses a wavelength-division-multiplexing (WDM) fused fiber-optic coupler 34 as a wavelength reference 28 of FIG. 1, to measure the mean wavelength of the pump source 16 (FIG. 2). The optical power exiting the two output ports 35 and 36 of the wavelength-division-multiplexing coupler 34 are used to derive spectral information at the point of insertion. Holding the two powers $I_1$ and $I_2$ in balance by detecting and nulling a differential error signal effects control of the average pump 16 wavelength $\lambda_p$ at the point of insertion. Advantages of this approach are traceable to the use of stable-fused silica material and fibers fused together to form a single glass structure. This structure gives a thermal coefficient of less than 5 ppm/degree C and a 10–12 ppm repeatability over a wide temperature range with very little thermal hysteresis. Thus, in conjunction with the FLS insensitivity to pump wave length, this device gives the needed accuracy and stability to control the pump source to 10 ppm, providing 0.35 ppm drift of the source 14 wavelength.

The pump 16 power, Pp in milliwatts (mW), coefficient, due to the influence of absorbed pump power on gyro source 14 mean wavelength, should be in the range of 0.3 to 12 ppm/0.1 mW, depending on the exact FLS 14 design and pump 16 wavelength. The pump power $P_p$, may also be conveniently monitored by the WDM 34 wavelength control device. Whereas a power difference change between the two WDM coupler output ports 35 and 36 is representative of a wavelength $\lambda_p$ shift, a change in the sum of the optical power outputs will represent a change in pump power $P_p$. By placing two matched photodetectors 43 and 44 at the two outputs 35 and 36 of the WDM 34, respectively, and combining their signals into sums at summing amplifier 45 and differences at differential amplifier 46, pump power $P_p$ and pump wavelength $\lambda_p$ shifts (respectively) may be observed and controlled, as shown in FIG. 2. In the case of pump wavelength $\lambda_p$, a signal 47 representative of an output difference can be used to adjust the temperature of the pump source 16 via pump wavelength servo electronics 38 and cooler (TEC) 20, and hence its wavelength. In the case of pump 16 power, a signal 48 representative of a shift in the sum of the WDM outputs $I_1$ and $I_2$ at ports 35 and 36, respectively, may be used to control the average pump current, and hence its power $P_p$.

It must be noted that the WDM coupler device 34 described above could also be used in principle to directly measure and control the actual source 14 wavelength $\lambda$. However, this device would have to be improved to 0.35 ppm stability to achieve equal stability in the gyro scale factor. This alternative is more difficult than the approach of controlling the pump wavelength described in this invention.

Figure 3:
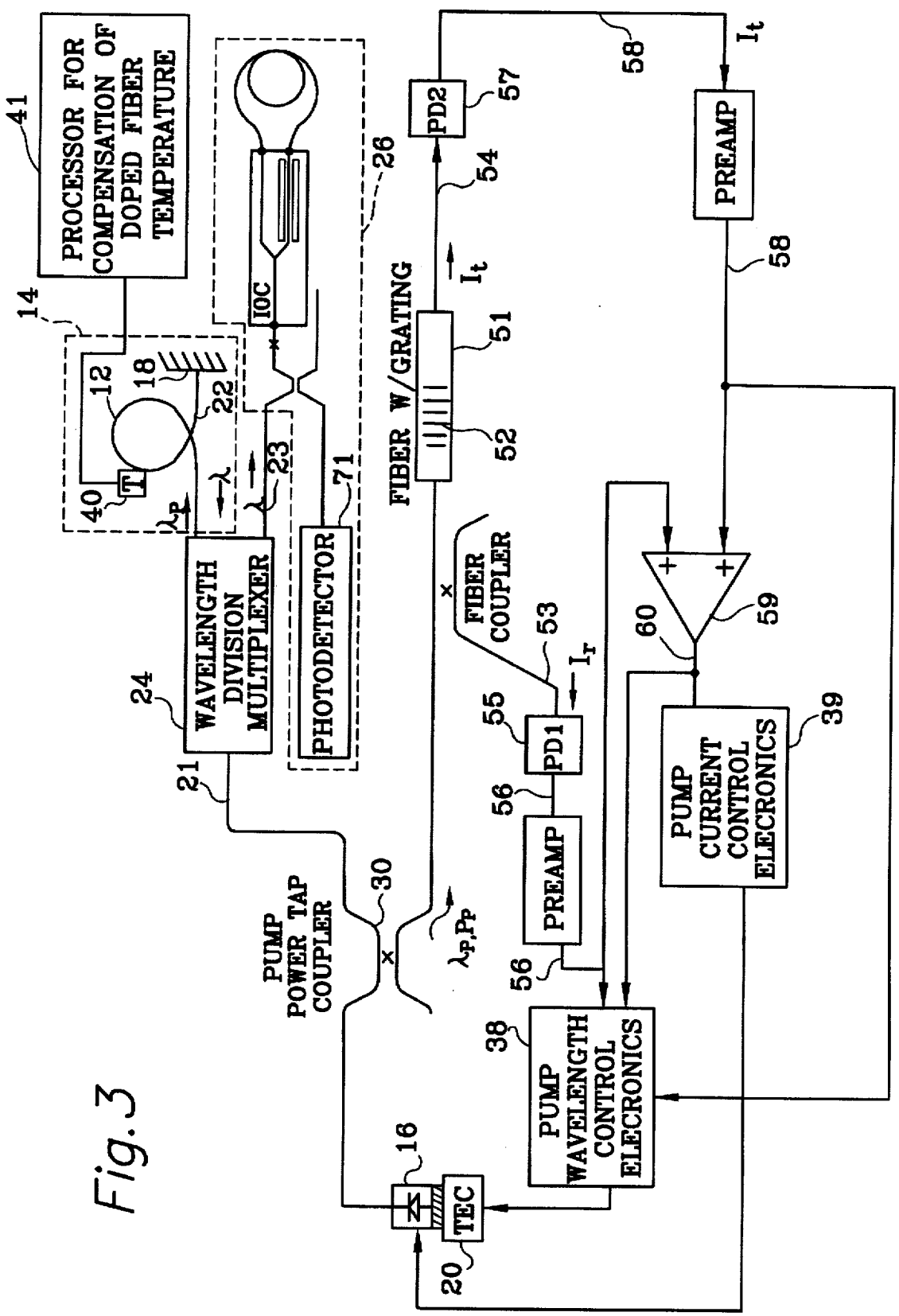
FIG. 3 is a diagram of a device that controls pump wavelength and power by use of a short length of fiber having an embedded grating.

Alternative devices for measuring and controlling the pump wavelength and pump power exist and may have advantages over the WDM coupler 34 device described above. For instance, light from the pump 16 may be directed through pump, power tap coupler 30 and a power splitting fiber coupler 50 into a short fiber length of fiber 51 with an embedded grating 52 as shown in FIG. 3. Grating 52 then, in turn, passes or reflects certain wavelengths within the pump source 16 spectrum. By measuring light 53 backreflected ($I_r$) from grating 52 (through the power splitter) and light 54 passed through the grating ($I_T$), the pump 16 wavelength $\lambda_p$ and pump power $P_p$ may be measured. Light 53 is converted by photodetector 55 into an electrical signal 56 representative of light $I_r$ 53. Light 54 is converted by photodetector 57 into an electrical signal 58 representative of light $I_r$ 54. Signals 56 and 58 are summed by summing amplifier 59 resulting in a sum signal 60 representative of the sum of light $I_t$ 53 and light $I_r$ 54. Signal 60 goes to pump current control electronics 39 which sends a controlling current to pump diode 16 to appropriately maintain pump 16 power $P_p$. Signals 56, 58 and 60 go to pump wavelength control electronics 38 to maintain pump 16 wavelength $\lambda_p$. Changes in the sum $I_t+I_r$ (53 and 54, respectively) are indicative of changes in pump power $P_p$, whereas changes in the normalized difference $$\frac{I_t-I_r}{I_t+I_r}$$

or changes in $$\frac{I_r}{I_t+I_r}$$

(depending on the exact design) are indicative of changes in pump wavelength $\lambda_p$.

Figure 4:
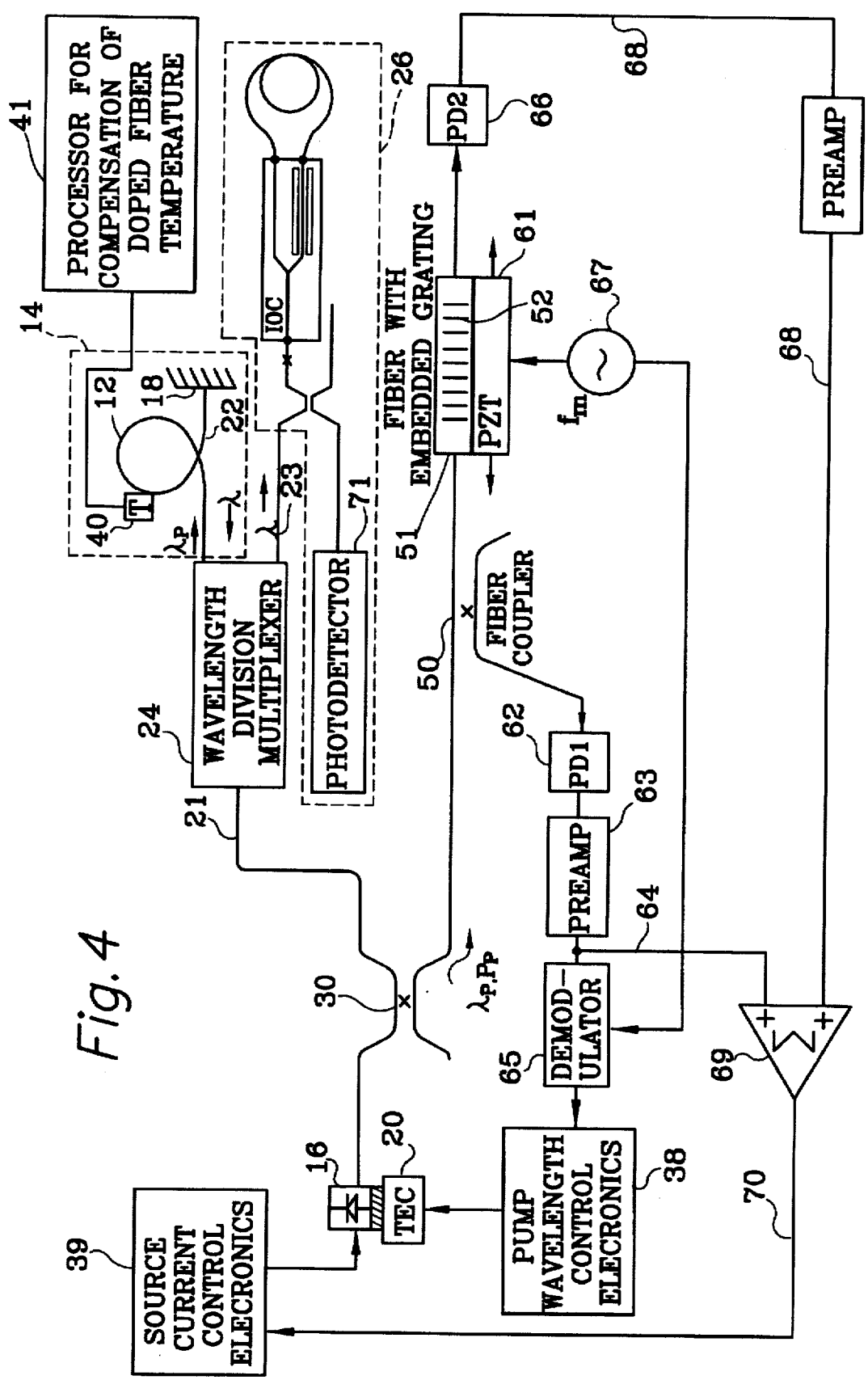
FIG. 4 is a diagram of a device that controls pump wavelength by use of a grating embedded fiber that is stretched at a modulation frequency so that the pump wavelength can be adjusted and locked to the center frequency of the grating by a servo feedback circuit.

One particularly attractive architecture is shown in FIG. 4 where a grating 52 embedded fiber 51 is stretched (via a piezoelectric transducer 61) at a frequency $f_m$ to detect small pump 16 wavelength shifts. Assuming the grating 52 wavelength is nominally chosen to be at the nominal mean pump 16 wavelength, the pump 16 wavelength $\lambda_p$ is adjusted and locked by the servo to the center frequency of the grating 52. In this case, the grating 52 (whose wavelength resonance width is narrower than the wavelength spectral width of the pump source 16) reflectance is maximum. By modulating the fiber 51 length by frequency $f_m$ by modulator source 67, and thus the grating 52 spacing, the output 64 of the PD1 62 preamp 63 is modulated. After demodulation according to frequency $f_m$ from modulator source 67 of the preamp signal 64, the servo will stabilize the pump 16 wavelength $\lambda_p$ to that pump wavelength where there is substantially no signal 64 (at frequency $f_m$) at the demodulator 65 input (see FIG. 4), i.e., to effectively the center of the grating 52 resonance (assuming a reasonably symmetric response function and pump wavelength spectrum).

The output light from fiber 52 goes to photodetector 66 to be converted into an electrical signal 68 that is summed with signal 64 by summing amplifier 69 into signal 70 that goes to source current control electronics 39 to maintain pump 16 power $P_p$ via current to pump diode 16.

Note that other effects on the effective optical wavelength have to be considered in the overall gyro 26 design. For instance, the exact wavelength which determines gyroscope scale factor is the mean wavelength observed at the photodetector 71. The wavelength-dependent transmission characteristics of the gyroscope optical components may have thermal dependencies. Such errors can be automatically corrected by a scale factor compensation algorithm over a particular temperature range.

Another issue is wavelength shifting due to aging of light source 14 which would result from pump wavelength $\lambda_p$ or pump power $P_p$ changing over time. These parameters can be controlled directly. In the event that aging effects are significant, an active wavelength stabilization can be introduced by controlling the pump 16 parameters to meet the desired requirements. This, of course, assumes that aging effects are small or in the wavelength reference device of choice than in pump source 16; however, in principle, passive wavelength references should be more stable over time than active semiconductor devices. This latter tradeoff is another advantage of the invention.

We claim:

1. A light source wavelength control device comprising:

a doped fiber light source having a wavelength $\lambda$;

a pump light source having a wavelength $\lambda_p$;

a coupler having a wavelength having a first port connected to said pump light source, a second port and a third port;

a wavelength division multiplexer having a first port connected to the second port of said coupler, a second port connected to said doped fiber light source, and a third port:

a wavelength reference having an input connected to the third port of said coupler, and having an output;

pump wavelength control electronics having an input connected to the output of said wavelength reference, and having an output;

a temperature controller proximate to said pump light source, having an input connected to the output of said pump wavelength control electronics;

a pump power reference having an input connected to the third port of said coupler, and having an output; and current control electronics having an input connected to the output of said pump power reference, and having an output connected to said pump light source.

2. The light source wavelength control device of claim 1 further comprising a temperature compensation processor connected said doped fiber light source.

3. The light source wavelength control device of claim 2, wherein said doped fiber light source has fiber doped with a rare-earth material.

* * * * *